United States Patent [19]

Davenport

[11] Patent Number: 5,343,175
[45] Date of Patent: Aug. 30, 1994

[54] MECHANICALLY TUNED SAW DEVICE AND METHOD OF TUNING SAME

[75] Inventor: Roger A. Davenport, Ft. Lauderdale, Fla.

[73] Assignee: Motorola, Inc., Schaumburg, Ill.

[21] Appl. No.: 116,625

[22] Filed: Sep. 7, 1993

[51] Int. Cl.⁵ .............................................. H03H 9/64
[52] U.S. Cl. ................................. 333/193; 310/313 R
[58] Field of Search ................ 333/193, 194, 195, 196; 310/313 R, 313 B, 313 C, 313 D; 73/617, 632

[56] References Cited

U.S. PATENT DOCUMENTS 4,096,740  6/1978  Sallée ................................. 73/88.5 R
4,705,979  11/1987  Sinha ................................. 310/313 A
5,093,638  3/1992  Kinsman et al. .

FOREIGN PATENT DOCUMENTS 0220516  12/1983  Japan ................................. 333/195
0314908  12/1988  Japan ................................. 333/194

OTHER PUBLICATIONS

1991 Ultrasonic Symposium, 1991 IEEE "SAW Inclinometer" by R. Motegi, H. Okajima, H. Ohuchi, and N. Guan, pp. 331-335.

Primary Examiner—Robert J. Pascal
Assistant Examiner—Darius Gambino
Attorney, Agent, or Firm—Andrew S. Fuller

[57] ABSTRACT

A surface acoustic wave device (100) having a tunable output includes a piezoelectric substrate (120) having a surface wave propagation structure, and a mechanism (130), mechanically coupled to the substrate (120), for mechanically deforming the substrate (120) in order to modify the output (114) of the surface acoustic wave device (100).

16 Claims, 2 Drawing Sheets

MECHANICALLY TUNED SAW DEVICE AND METHOD OF TUNING SAME

TECHNICAL FIELD

This invention relates in general to surface acoustic wave devices.

BACKGROUND

Surface acoustic wave (SAW) devices use surface waves propagated on the surface of an elastic solid for electronic signal processing. A typical SAW device uses a transducer to convert electromagnetic signal waves, which travel at the speed of light, to acoustic signal waves traveling at speeds on the order of $10^5$ less than the speed of light. This substantial reduction in wavelength allows designers to implement certain complex signaling processing functions in a significantly smaller space than would be needed for traditional circuit designs. Thus, a SAW device designed to handle complex signal processing functions can offer considerable cost and size advantages over competing technologies. SAW technology is increasingly found in applications such as filters, resonators, oscillators, delay lines, and other similar devices.

SAW devices are typically implemented on a piezoelectric substrate and usually employ interdigitated transducers (IDTs) located on the surface of the piezoelectric substrate to generate and detect acoustic waves. The geometry of the IDTs on the piezoelectric substrate plays a significant role in the signal processing and frequency response characteristics of a SAW device. Changes in temperature may also affect the operation of the device. SAW device designers generally achieve the desired frequency response of the device by focusing on the geometry of the IDTs, and by the choice of materials used for the piezoelectric substrate.

Once the design parameters are chosen for a SAW device, the device may operate satisfactorily under certain conditions, but may fail to properly perform as the operating environment changes. For example, a SAW device may fail to operate because of adverse effects of temperature on the material of the device. To compensate for the operating environment dependency of the SAW devices, designers have tended towards more complex designs. SAW device performance is also affected in other ways. For example, variations in the process used to manufacture a SAW device may affect its operating characteristics, and depending on the application, compensating adjustments to the device may be needed.

Performance degradation of SAW devices as a result of varying operating conditions in the field can lead to poor performance and even field failures. Designs which focused on more complex IDT geometries can improve performance, but may result in an increase in manufacturing cost and complexity. The ability to tune SAW devices to account for operating conditions or for manufacturing variations is rather limited in the art. Consequently, there exists a need in the art to address manufacturing variations and operating conditions dependency of SAW devices.

DETAILED DESCRIPTION OF THE PREFERRED EMBODIMENT

The response of a surface acoustic wave (SAW) device is substantially influenced by the phase velocity of the surface wave as it travels along the surface of the piezoelectric substrate. The phase velocity of a surface wave on a piezoelectric substrate is given by:

$$\text{Phase Velocity} = \sqrt{\frac{\left(\frac{e^2}{\epsilon} + c\right)}{\rho}}$$

where 'e' is a value from the piezoelectric strain matrix, '$\epsilon$' is the dielectric constant of the substrate, 'c' is a stiffness elastic value (from a fourth rank tensor matrix), and 'p' is the mass density of the substrate. By changing any of these physical properties, the velocity of the surface wave will change with a corresponding change in the operating parameters of the device, such as the frequency of a SAW resonator, or the amount of delay in a SAW delay line. Since the amount of change in the effective elastic constant due to the piezoelectric stiffening term ($e^2/\epsilon$) is small, the major factors in determining velocity are the mass density and the elastic constant. Flexing or bending the device substrate effects changes in the mass density, the elastic constant values, and the physical geometry of device.

Figure 1:
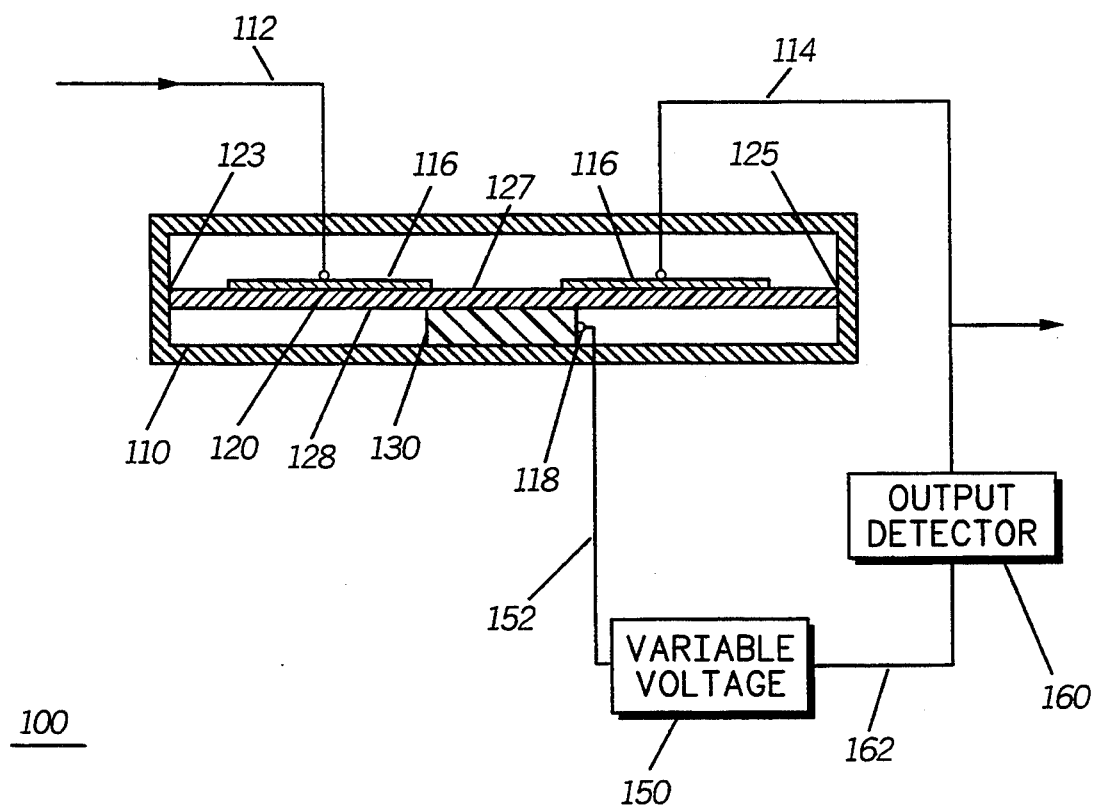
FIG. 1 shows a tunable surface acoustic device in accordance with the present invention.

FIG. 1 shows a SAW device 100 which includes a piezoelectric substrate 120, a piezoelectric ceramic block 130, and a device housing 110. The SAW device 100 has electrical ports to handle input signals 112 and output signals 114. Additionally, the device 100 includes an electrical connection 118 to provide an interface to the piezoelectric block 130. Various configurations of the SAW device 100 are possible, depending upon the SAW application and the particular implementation design chosen. However, according to the invention, there is provided a piezoelectric substrate 120 with a SAW structure thereon, and a mechanism 130 for mechanically deforming the substrate 120.

The piezoelectric substrate is formed from a material such as quartz, lithium niobate, lithium tantalate, zinc oxide, aluminum nitride, or other similar materials. The substrate 120 has a first planar surface 127, and a second planar surface 128 opposite to the first planar surface 127. The first planar surface 127 forms a surface wave medium upon which surface acoustic waves travel. The first planar surface 127, i.e., the surface wave medium, contains the surface wave propagation structure in the form of a patterned metallization layer 116, which implements the particular SAW application. Applications include filters, resonators, oscillators, delay lines, and the like. In the preferred embodiment, two ends 123, 125 of the substrate 120 are affixed to the housing 110, thereby rigidly constraining the portion of the substrate 120 near the ends 123, 125. According to the invention, a portion of the substrate 120 is mechanically deformed to alter the wave propagation characteristics of the surface wave medium 127, thereby modifying or tuning the SAW device output. Thus, a deformation mechanism to mechanically deform the substrate is included with the SAW device.

In the preferred embodiment, the piezoelectric block 130 is used to selectively deform the substrate 120 of the SAW device 100. As is well known in the art, piezoelectric materials are capable of converting electrical energy into mechanical energy. The piezoelectric block 130 is chosen to have a high longitudinal electromechanical coupling factor, which can produce a large electromechanical force in response to the application of an electric field across the block 130. An example of a piezoelectric material suitable for this purpose is lead zirconium titanate. The piezoelectric block 130 is mechanically coupled to the second planar substrate 120 between the two end portions 123, 125 of the substrate 120, such that the block 130 can transfer mechanical force to the substrate 120.

Applying an electric field across the piezoelectric block 130 causes the block 130 to either contract or expand depending the polarity of the electric field. The piezoelectric block 130 is mechanically coupled to the substrate 120 such that the mechanical force produced by the expansion or contraction of the block 130 is directed normal to the planar surface 127 of the substrate 120. An expanding block 130 causes the substrate 120 to deform away from the block 130, and a contracting block 130 causes the substrate 120 to deform towards the block 130. In the preferred embodiment, a voltage from a variable voltage source 150 responds to a control signal 162 to produce the electric field across the block 130. Thus, the piezoelectric block 130 provides a mechanism, responsive to a control signal 162, for selectively deforming the substrate 120.

Another aspect of the present invention is an ability to dynamically tune the SAW device 100 based on the information from the device output signal 114 or based on other applicable parameters. In the preferred embodiment, an output detector 160 measures the device output signal 114 and provides the control signal 162 to the variable voltage source 150. The control signal 162 causes the variable voltage source 150 to vary the magnitude of the voltage 152, thereby varying the electric field across the block 130. Control of the polarity and magnitude of the electric field across the block 130 allows control of the magnitude and direction of the deformation of the piezoelectric block 130, and controlled modification of the SAW device output. Parameters, derived from sources other than from the SAW device output signal 114, may be used in generating the control signal 162 for dynamic tuning. For example, the control signal 162 may be based on the operating temperature of the SAW device, or other environmental or electrical parameters which may affect the performance of the SAW device 100.

Figure 2:
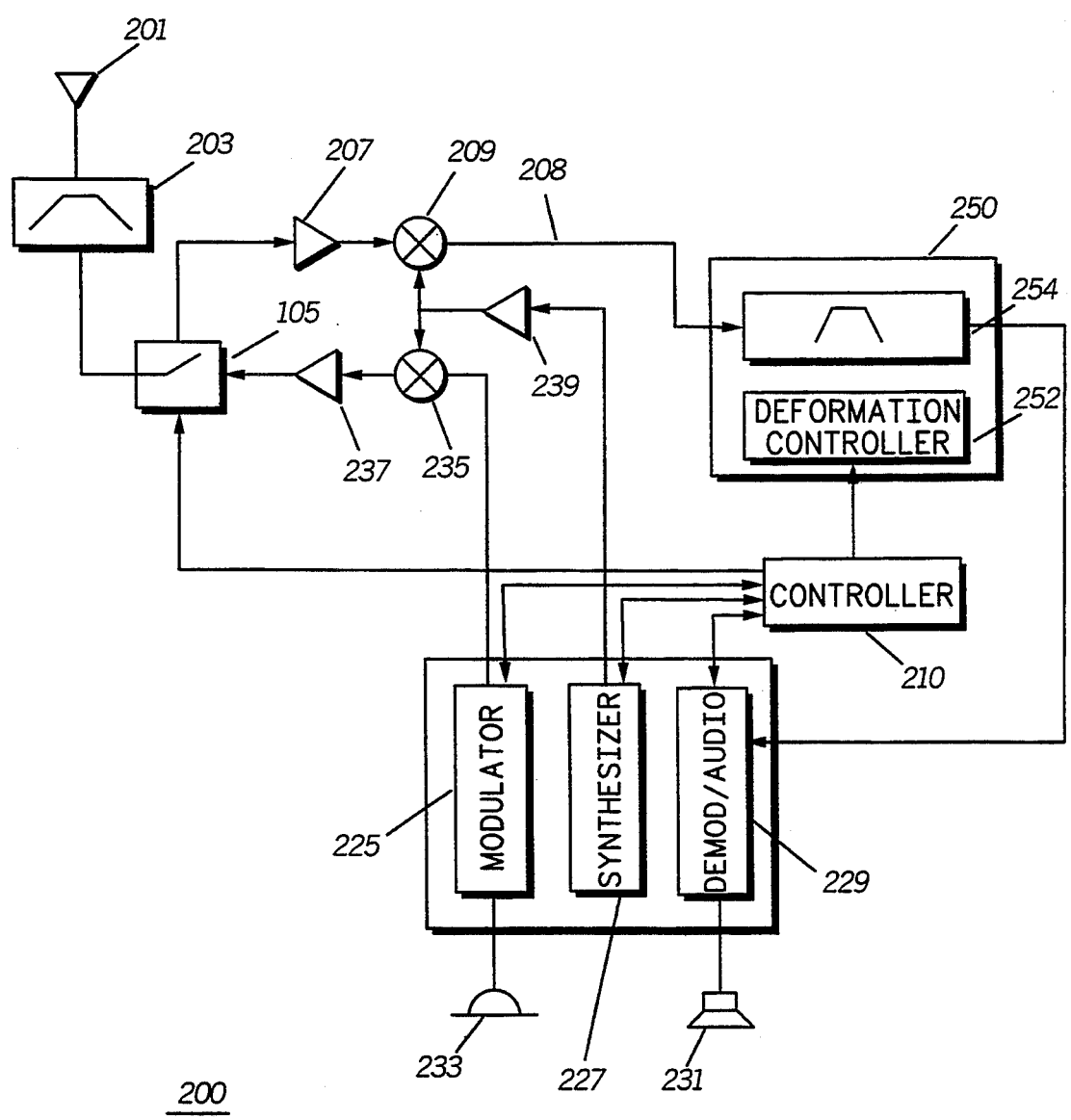
FIG. 2 shows a block diagram of a radio incorporating a tunable surface acoustic wave filter, in accordance with the present invention.

Referring to FIG. 2, a block diagram for a radio 200 of a well known general configuration is shown, which additionally incorporates a circuit with a tunable SAW intermediate frequency (IF) filter, in accordance with the present invention. The radio 200 is an electronic device used for two way communications, and is capable of receive and transmit operations. A controller 210 controls the overall operation of the radio. In the receive mode, a communications signal is received by an antenna 201 which applies the signal to a filter 203 for initial selectivity at the receiver front end. The received signal passes through an antenna switch 205 which, under the control of the controller 210, applies it to a preamplifier stage 207. The preamplifier stage 207 amplifies the received signal and applies it to a mixer 209. The mixer 209 receives a local oscillator (LO) signal generated by a synthesizer 227 through a LO amplifier 239 to provide an IF signal 208. Under the control of the controller 210, the synthesizer 227 generates the proper local oscillator frequency to permit the radio to receive communication signals at a predetermined carrier frequency.

The IF signal 208 is applied to an IF filter stage comprising a tunable SAW filter 250 according to the present invention. Conventional SAW filters are known in the art, as is exemplified in U.S. Pat. No. 5,093,638, issued to Kinsman et al. on Nov. 5, 1990, for an Unbalanced SAW Filter. The tunable SAW filter 250 incorporates a conventional SAW filter structure design implemented on a piezoelectric substrate 254, and further comprises a deformation controller 252 for mechanically deforming the substrate 254. The deformation controller 252 is responsive to a control signal generated by the controller 210 for adjusting the output of the IF stage. The deformation controller 252 can be implemented using a variable voltage source electrically coupled to a piezoelectric block which is mechanically coupled to the piezoelectric substrate 254. Thus, the IF signal 208 is appropriately filtered by the tunable SAW filter 250 as specified by the control signal.

It is well known in the art that a SAW IF filter may have a shift in frequency response as a result of temperature changes or aging. Filter designers often compensate for this behavior by designing the filter to operate over a wider bandwidth than would be required if the shift in frequency response did not occur. Consequently, the filter may leave unfiltered undesirable frequencies, which results in a noisier filter output. A dynamically tuned SAW filter 250, according to the invention, can eliminate shifts in frequency response by counteracting the effects of temperature or aging, thereby eliminating the need for filter designs having a wider than necessary bandwidth.

The output of the SAW filter 250 is applied to a well known demodulator/audio stage 229 which also operates under the control of the controller 210. The modulator/audio stage 229 may be arranged using well known software or hardware controlled schemes to provide more than one demodulation technique. In this way, the controller 210 may also specify, again, based on the modulation offered by the communication system, the type of demodulation technique needed for recovering the received message. The output of the demodulator/audio stage 229 is applied to a speaker 231 to render the received messages audible.

In transmit mode, a communicated message as inputted through a microphone 233 is applied to a modulator 225 which operates under the control of the controller 210. The controller 210 may also specify to the modulator the type of modulation technique required, according to the communication system in use. The output of the modulator is applied to a transmitter IF mixer 235 which receives a transmitter local oscillator signal from the synthesizer 227. The output of the transmitter IF mixer 235 is amplified by an amplifier 237. The communication messages from the communication unit 200 are radiated through the antenna 201 after being applied to the antenna switch 205 and the filter 203.

Referring back to FIG. 1, according to the invention, the mechanical properties of piezoelectric materials have been exploited to produce a tunable SAW device 100. By mechanically deforming the piezoelectric substrate 120 which contains the SAW structure, the response of the SAW device 100 is altered. In the preferred embodiment, the mechanical deformation of the substrate is effected using a piezoelectric block 130 mechanically coupled to the substrate 120, and deformation is controlled by varying an electric field across the block 130. However, other deformation mechanisms may be used to deform the substrate 120. The ability to dynamically adjust the response of a SAW device is extremely useful in many applications. A device incorporating the present invention may be factory tuned for optimum performance, so as to account for minor manufacturing variations, for example, or the device may be automatically tunable to maintain an appropriate level of performance in varying field operating environments. The ability to tune SAW devices can also reduce the cost and complexity of SAW device designs by permitting the relaxation of design parameters.

What is claimed is:

1. A surface acoustic wave device having a tunable output, comprising:
   a piezoelectric substrate having a surface wave propagation structure thereon; and
   deformation means, mechanically coupled to said substrate, for mechanically deforming said substrate thereby tuning the device output, said deformation means being responsive to a control signal for controlling the deformation of the substrate.

2. A surface acoustic wave device having a tunable output as defined in claim 1, wherein the device comprises a surface acoustic wave filter.

3. A surface acoustic wave device having a tunable output, comprising;
   a piezoelectric substrate having a surface wave propagation structure thereon; and
   deformation means, mechanically coupled to said substrate, for mechanically deforming said substrate thereby tuning the device output, wherein said deformation means comprises:
   a piezoelectric block; and
   an electrical source coupled to said piezoelectric block such that an electric field is selectively applied to said block which causes the deformation of said block and said substrate.

4. A surface acoustic wave device having a tunable output as defined in claim 3, wherein:
   said electrical source is responsive to a control signal to provide a variable output.

5. A surface acoustic wave device having a tunable output as defined in claim 1, further comprising:
   a housing for said piezoelectric substrate;
   said substrate having end portions constrained by said housing; and
   said deformation means being mechanically coupled to said substrate between said end portions.

6. A surface acoustic wave device having a tunable output as defined in claim 1, further comprising:
   measuring means for measuring the device output, and for providing the control signal based on the measured output.

7. A surface acoustic wave device having a tunable output as defined in claim 6, wherein the device comprises a surface acoustic wave filter.

8. A surface acoustic wave device having a tunable output, comprising:
   a piezoelectric substrate having constrained end portions, said substrate having a first planar surface for surface acoustic wave propagation, and a second planar surface opposite to said first surface;
   a piezoelectric block mechanically coupled to the second planar surface of said substrate, said block being deformable to produce a force on said substrate in a direction normal to said first surface; and
   a variable voltage source electrically coupled to said piezoelectric block such that there is a deformation of said block and a modification of the device output.

9. A radio, comprising: a radio receiver having a mechanically tuned SAW device, the SAW device comprising:
   a piezoelectric substrate with a surface wave propagation structure thereon; and
   deformation means, mechanically coupled to said substrate, for mechanically deforming said substrate thereby modifying the device output, said deformation means being responsive to a control signal for controlling the deformation of the substrate.

10. A radio, comprising: a radio device having a tunable output, comprising:
   a piezoelectric substrate having constrained end portions, said substrate having a first planar surface for surface acoustic wave propagation, and a second planar surface opposite to said first surface;
   a piezoelectric block mechanically coupled to the second planar surface of said substrate, said block being deformable to produce a force on said substrate in a direction normal to said first surface; and
   a variable voltage source electrically coupled to said piezoelectric block such that there is a deformation of said block and a modification of the device output.

11. A method of tuning the output of a surface acoustic wave device, comprising the steps of:
   providing a surface acoustic wave propagation structure on a surface wave medium;
   selectively applying a mechanical force to the surface wave medium, in response to a control signal for controlling the deformation of the medium, to deform the medium thereby tuning the device output.

12. A method of tuning the output of a surface acoustic wave device, comprising the steps of:
   providing a surface acoustic wave propagation structure on a surface wave medium:
   selectively applying a mechanical force to the surface wave medium to deform the medium thereby tuning the device output;
   constraining a portion of the surface wave medium;
   mechanically coupling the surface wave medium to a piezoelectric block; and
   applying an electric field across the piezoelectric block to deform the piezoelectric block to selectively produce the mechanical force.

13. A method of tuning the output of a surface acoustic wave device as defined in claim 12, further comprising the step off:
   varying the electric field applied to the piezoelectric block to selectively change the deformation of the surface wave medium and thereby tuning the output of the device.

14. A method of tuning the output of a surface acoustic wave device as defined in claim 11, further comprising the steps off:
   providing a housing for the surface wave medium;
   constraining two end portions of the surface wave medium with the housing; and applying the mechanical force to a portion of the surface wave medium between the two constrained portions.

15. A method of tuning the output of a surface acoustic wave device as defined in claim 11, further comprising the steps of:

measuring the device output; and adjusting the mechanical force based on the measured output of the device to produce a tuned device output.

16. A surface acoustic wave device having a tunable output as defined in claim 1, wherein said deformation means comprises a piezoelectric block, said piezoelectric block being responsive to an electric signal, selectively applied to said block, to cause the deformation of said block and said substrate.

* * * * *